US009633840B2

(12) United States Patent
Genba

(10) Patent No.: US 9,633,840 B2
(45) Date of Patent: Apr. 25, 2017

(54) METHOD OF MANUFACTURING SILICON CARBIDE SEMICONDUCTOR SUBSTRATE AND METHOD OF MANUFACTURING SILICON CARBIDE SEMICONDUCTOR DEVICE

(71) Applicant: Sumitomo Electric Industries, Ltd., Osaka-shi (JP)

(72) Inventor: Jun Genba, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/152,347

(22) Filed: May 11, 2016

(65) Prior Publication Data

US 2016/0254149 A1 Sep. 1, 2016

Related U.S. Application Data

(63) Continuation of application No. 14/424,768, filed as application No. PCT/JP2013/083325 on Dec. 12, 2013, now Pat. No. 9,368,345.

(30) Foreign Application Priority Data

Feb. 7, 2013 (JP) ................................ 2013-022220

(51) Int. Cl.
*H01L 21/20* (2006.01)
*H01L 21/36* (2006.01)
(Continued)

(52) U.S. Cl.
CPC ...... *H01L 21/02529* (2013.01); *C23C 16/325* (2013.01); *C23C 16/45523* (2013.01);
(Continued)

(58) Field of Classification Search
CPC . H01L 21/02365; H01L 21/20; H01L 21/314; H01L 21/31666; H01L 21/31679;
(Continued)

(56) References Cited

U.S. PATENT DOCUMENTS 5,463,978 A 11/1995 Larkin et al.
5,709,745 A 1/1998 Larkin et al.
(Continued)

FOREIGN PATENT DOCUMENTS

CN 102782823 A 11/2012
JP 07-6971 1/1995
(Continued)

OTHER PUBLICATIONS

International Search Report and Written Opinion in PCT International Application No. PCT/JP2013/083325, dated Mar. 18, 2014.
(Continued)

*Primary Examiner* — Sonya D McCall Shepard
(74) *Attorney, Agent, or Firm* — Venable LLP; Michael A. Sartori; F. Brock Riggs

(57) ABSTRACT

A step of preparing a silicon carbide substrate (S11), a step of forming a first silicon carbide semiconductor layer on the silicon carbide substrate using a first source material gas (S12), and a step of forming a second silicon carbide semiconductor layer on the first silicon carbide semiconductor layer using a second source material gas (S13) are provided. In the step of forming a first silicon carbide semiconductor layer (S12) and the step of forming a second silicon carbide semiconductor layer (S13), ammonia gas is used as a dopant gas, and the first source material gas has a C/Si ratio of not less than 1.6 and not more than 2.2, the C/Si ratio being the number of carbon atoms to the number of silicon atoms.

9 Claims, 4 Drawing Sheets

(51) Int. Cl.
*H01L 21/02* (2006.01)
*C23C 16/32* (2006.01)
*C23C 16/455* (2006.01)

(52) U.S. Cl.
CPC ...... *H01L 21/0257* (2013.01); *H01L 21/0262* (2013.01); *H01L 21/02378* (2013.01); *H01L 21/02447* (2013.01); *H01L 21/02576* (2013.01)

(58) Field of Classification Search
CPC ........... H01L 21/3205; H01L 21/32056; H01L 31/0256; H01L 33/0054; H01L 33/0083; H01L 33/02; H01L 51/0002; H01L 438/481; H01L 21/02636; H01L 21/2018
USPC ....... 438/478, 481, 495, 502, 503, 505–510; 257/77, 263
See application file for complete search history.

(56) References Cited

U.S. PATENT DOCUMENTS

| | | | |
|---|---|---|---|
| 6,764,958 | B1 | 7/2004 | Nemani et al. |
| 2005/0173739 | A1* | 8/2005 | Kusumoto .......... H01L 21/0485 257/263 |
| 2009/0317983 | A1 | 12/2009 | Miyanagi et al. |
| 2011/0212599 | A1 | 9/2011 | Kuribayashi et al. |
| 2011/0312161 | A1 | 12/2011 | Hamano et al. |
| 2012/0199848 | A1 | 8/2012 | Ito et al. |
| 2013/0105819 | A1* | 5/2013 | Kameshiro ........... H01L 21/046 257/77 |
| 2014/0145214 | A1 | 5/2014 | Kageshima et al. |
| 2015/0214306 | A1* | 7/2015 | Kojima ............ H01L 21/02378 257/77 |

FOREIGN PATENT DOCUMENTS

| | | |
|---|---|---|
| JP | 2002-280573 A | 9/2002 |
| JP | 2003-318388 A | 11/2003 |
| JP | 2006-261612 A | 9/2006 |
| JP | 2011-044744 A | 3/2011 |
| JP | 2011-205059 | 10/2011 |
| JP | 2012-164790 A | 8/2012 |
| WO | WO-2010/101016 A1 | 9/2010 |
| WO | 2013/011923 A1 | 1/2013 |

OTHER PUBLICATIONS

Notification of First Office Action in counterpart Chinese Patent Application No. 201380069237.9, dated Sep. 2, 2016.
Extended European Search Report in counterpart European Patent Application No. 13874534.4, dated Oct. 4, 2016.
Notice of Grounds of Rejection in Japanese Patent Application No. 2013-022220, dated Aug. 23, 2016.

* cited by examiner

METHOD OF MANUFACTURING SILICON CARBIDE SEMICONDUCTOR SUBSTRATE AND METHOD OF MANUFACTURING SILICON CARBIDE SEMICONDUCTOR DEVICE

CROSS REFERENCE TO RELATED APPLICATION

This application is a Continuation of U.S. patent application Ser. No. 14/424,768, filed Feb. 27, 2015, which is a 371 application of International Application No. PCT/JP2013/083325, filed Dec. 12, 2013, which claims the benefit of Japanese Patent Application No. 2013-022220, filed Feb. 7, 2013.

TECHNICAL FIELD

The present invention relates to methods of manufacturing silicon carbide semiconductor substrates and methods of manufacturing silicon carbide semiconductor devices, and more particularly to a method of manufacturing a silicon carbide semiconductor substrate capable of readily manufacturing a silicon carbide semiconductor substrate having a high impurity concentration, and a method of manufacturing a silicon carbide semiconductor device using this silicon carbide semiconductor substrate.

BACKGROUND ART

In recent years, silicon carbide (SiC) has been increasingly employed as a material for a semiconductor device in order to allow a higher breakdown voltage, lower loss and the like of the semiconductor device. Silicon carbide is a wide band gap semiconductor having a band gap wider than that of silicon which has been conventionally and widely used as a material for a semiconductor device. By employing the silicon carbide as a material for a semiconductor device, therefore, a higher breakdown voltage, lower on-resistance and the like of the semiconductor device can be achieved. A semiconductor device made of silicon carbide is also advantageous in that performance degradation is small when used in a high-temperature environment as compared to a semiconductor device made of silicon.

Since silicon carbide has an extremely low impurity diffusion coefficient, it is difficult to dope the silicon carbide with an impurity through a thermal diffusion process. Methods of forming an active region in a silicon carbide material include a method of implanting ions into an epitaxial growth layer, and an epitaxial growth method involving the addition of impurities using a dopant gas (see Japanese Patent Laying-Open No. 2002-280573 (PTD 1), for example).

Generally, when forming an n type epitaxial layer on a silicon carbide substrate, nitrogen ($N_2$) gas is used as a dopant gas. A growth temperature during this process is generally approximately not less than 1400° C. and not more than 1700° C.

Nitrogen molecules include a triple bond between nitrogen atoms, however. It is thus difficult to thermally decompose nitrogen molecules and introduce nitrogen atoms as an active species into the silicon carbide epitaxial layer.

CITATION LIST

Patent Document

PTD 1: Japanese Patent Laying-Open No. 2002-280573

SUMMARY OF INVENTION

Technical Problem

A possible method of increasing the amount of nitrogen atoms introduced into a silicon carbide epitaxial layer to thereby increase the impurity concentration in the silicon carbide epitaxial layer is to reduce a ratio of the number of carbon (C) atoms to the number of silicon (Si) atoms (C/Si ratio) in a source material gas used during epitaxial growth.

Generally, epitaxial growth of an n type silicon carbide film using $N_2$ gas as a dopant gas is performed under conditions such that the C/Si ratio of carbon (C) to silicon (Si) in a source material gas is not less than 1.0 and not more than 1.5. This is because, when $N_2$ gas is used as a dopant gas and the C/Si ratio is higher than 1.5, it is difficult to add N as an impurity into the epitaxial layer to a sufficient degree. This is also because, when $N_2$ gas is used as a dopant gas and the C/Si ratio is lower than 1.0, although N can be added as an active species into the epitaxial layer to a sufficient degree, it is believed that the grown epitaxial layer has poor morphology.

Accordingly, if epitaxial growth is performed using a source material gas having a lower C/Si ratio than the above conventional value so as to increase the impurity concentration in a silicon carbide epitaxial layer, it is believed that the silicon carbide epitaxial layer to be obtained has even poorer morphology.

The present invention has been made to solve the problem as described above. A main object of the present invention is to provide a method of manufacturing a silicon carbide semiconductor substrate capable of readily manufacturing a silicon carbide semiconductor substrate which includes an n type silicon carbide epitaxial film having a high impurity concentration and which has good morphology, and a method of manufacturing a silicon carbide semiconductor device.

Solution to Problem

The present inventor conducted a detailed research in order to solve the problem as described above, and found that a silicon carbide semiconductor substrate which includes an n type silicon carbide epitaxial film having a high impurity concentration and which has good morphology can be manufactured by growing an n type silicon carbide epitaxial layer using ammonia ($NH_3$) gas as a dopant gas, and using a source material gas having a C/Si ratio, which is the number of C atoms to the number of Si atoms, of not less than 1.6 and not more than 2.2.

A method of manufacturing a silicon carbide semiconductor substrate of the present invention includes steps of preparing a silicon carbide substrate, forming a first silicon carbide semiconductor layer on the silicon carbide substrate using a first source material gas, and forming a second silicon carbide semiconductor layer on the first silicon carbide semiconductor layer using a second source material gas, in which, in the step of forming a first silicon carbide semiconductor layer and the step of forming a second silicon carbide semiconductor layer, ammonia gas is used as a dopant gas, and the first source material gas has a C/Si ratio of not less than 1.6 and not more than 2.2, the C/Si ratio being the number of carbon atoms to the number of silicon atoms.

Consequently, the method of manufacturing a silicon carbide semiconductor substrate of the present invention can readily manufacture a silicon carbide semiconductor substrate which includes an n type silicon carbide epitaxial film having a high impurity concentration and which has good surface morphology.

An impurity concentration in the first silicon carbide semiconductor layer is higher than an impurity concentration in the second silicon carbide semiconductor layer. The thickness of the first silicon carbide semiconductor layer is smaller than the thickness of the second silicon carbide semiconductor layer.

A method of manufacturing a silicon carbide semiconductor device of the present invention includes steps of preparing a silicon carbide semiconductor substrate, and processing the silicon carbide semiconductor substrate. In the step of preparing a silicon carbide semiconductor substrate, the silicon carbide semiconductor substrate is manufactured with the method of manufacturing a silicon carbide semiconductor substrate according to the invention described above.

Consequently, performance degradation of the silicon carbide semiconductor device resulting from defects and poor morphology of the silicon carbide semiconductor substrate including the n type epitaxial film having a high impurity concentration can be suppressed, thus allowing for high-yield manufacturing of silicon carbide semiconductor devices.

Advantageous Effects of Invention

According to the method of manufacturing a silicon carbide semiconductor substrate of the present invention, a silicon carbide semiconductor substrate which includes an n type silicon carbide epitaxial film having a high impurity concentration and which has good morphology can be readily manufactured. Moreover, according to the method of manufacturing a silicon carbide semiconductor device of the present invention, performance degradation of the silicon carbide semiconductor device resulting from defects and poor morphology of the silicon carbide semiconductor substrate can be suppressed.

DESCRIPTION OF EMBODIMENTS

Figure 1:
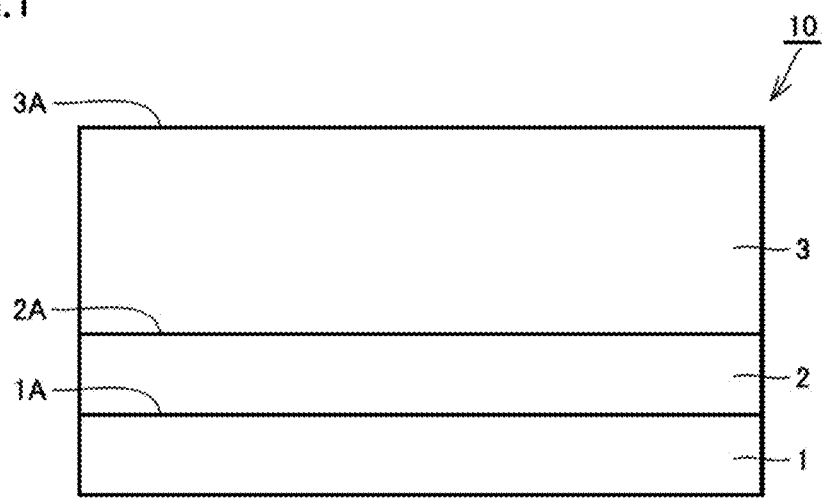
FIG. 1 is a sectional view of a silicon carbide semiconductor substrate of this embodiment.

A method of manufacturing a silicon carbide semiconductor substrate according to an embodiment of the present invention will be described below. The method of manufacturing a silicon carbide semiconductor substrate according to this embodiment is a method of manufacturing a silicon carbide semiconductor substrate by stacking a plurality of silicon carbide epitaxial layers having different impurity concentrations on a silicon carbide substrate. Referring first to FIG. 1, a silicon carbide semiconductor substrate 10 according to this embodiment is described. Silicon carbide semiconductor substrate 10 according to this embodiment includes a silicon carbide a buffer layer 2 made of silicon carbide and formed on silicon carbide substrate 1, and a drift layer 3 made of silicon carbide and formed on buffer layer 2.

Silicon carbide substrate 1 is made of single-crystal silicon carbide, for example. The single-crystal silicon carbide has a hexagonal crystal structure, for example. Silicon carbide substrate 1 has a main surface 1A.

Buffer layer 2 is formed on main surface 1A of silicon carbide substrate 1. Buffer layer 2 has n type conductivity and a thickness of 0.5 μm. An n type impurity concentration in buffer layer 2 is approximately $1 \times 10^{18}$ cm$^{-3}$. Buffer layer 2 has a main surface 2A.

Drift layer 3 is formed on buffer layer 2. Drift layer 3 has n type conductivity and a thickness of 10 μm. An n type impurity concentration in drift layer 3 is approximately $7 \times 10^{15}$ cm$^3$. Drift layer 3 has a main surface 3A, which serves as a main surface of silicon carbide semiconductor substrate 10.

Figure 2:
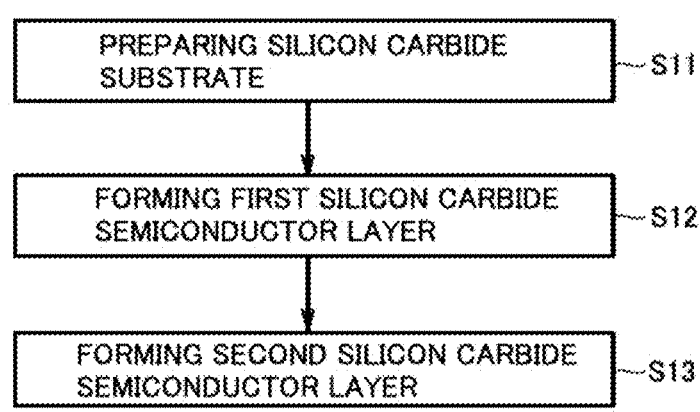
FIG. 2 is a flowchart of a method of manufacturing the silicon carbide semiconductor substrate of this embodiment.

Referring now to FIGS. 1 and 2, the method of manufacturing a silicon carbide semiconductor substrate of this embodiment for manufacturing the above-described silicon carbide semiconductor substrate is described. The method of manufacturing a silicon carbide semiconductor substrate includes a step of preparing a silicon carbide substrate (S11), a step of forming a buffer layer on the silicon carbide substrate using a first source material gas (S12), and a step of forming a drift layer on the buffer layer using a second source material gas (S13).

First, in the step (S11), silicon carbide substrate 1 is prepared. Silicon carbide substrate 1 is made of single-crystal silicon carbide. Silicon carbide substrate 1 is disk-shaped and has a thickness of 350 μm.

Figure 3:
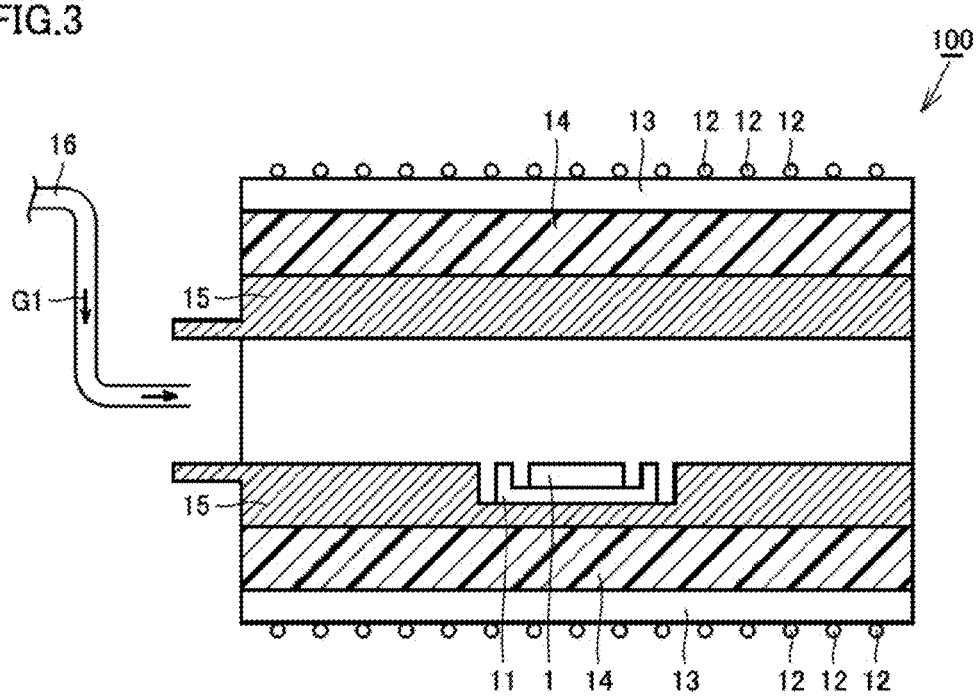
FIG. 3 is a schematic diagram of a vapor phase epitaxy device used in the method of manufacturing the silicon carbide semiconductor substrate of this embodiment.

Next, in the step (S12), buffer layer 2 is formed using a vapor phase epitaxy device on silicon carbide substrate 1 prepared in the previous step (S11). Referring to FIG. 3, a CVD (Chemical Vapor Deposition) device 100 is used as the vapor phase epitaxy device in this embodiment. In CVD device 100, a substrate holder 11 is surrounded by an induction heating coil 12, a quartz tube 13, a heat insulating material 14, and a heating element 15. Specifically, heating element 15 has a hollow structure and forms a reaction chamber therein. Substrate holder 11 is provided within heating element 15, and formed, for example, such that main surface 1A of silicon carbide substrate 1 is flush with the surface of the reaction chamber when silicon carbide substrate 1 is placed therein. Heat insulating material 14 is arranged so as to surround the outer periphery of heating element 15. Quartz tube 13 is arranged so as to surround the outer periphery of heat insulating material 14. Induction heating coil 12 includes a plurality of coil members, and is provided, for example, so as to be wound around the outer periphery of quartz tube 13. When a high-frequency current is passed through induction heating coil 12 serving as a high-frequency coil, heating element 15 is inductively heated by the action of electromagnetic induction. Consequently, silicon carbide substrate 1, the source material gases supplied to silicon carbide substrate 1, and the like can be heated to a prescribed temperature.

First, silicon carbide substrate 1 is placed in substrate holder 1 provided within CVD device 100. Then, a carrier gas containing hydrogen ($H_2$), and a source material gas containing monosilane ($SiH_4$), propane ($C_3H_8$), ammonia ($NH_3$) and the like are introduced into CVD device 100 through a pipe 16. Here, each gas is introduced into the reaction chamber such that the gas has been thermally decomposed to a sufficient degree at the time when supplied onto main surface 1A of silicon carbide substrate 1. The gases may be mixed together before being introduced into the reaction chamber of CVD device 100, or may be mixed together within the reaction chamber of CVD device 100.

Silicon carbide substrate 1 placed on substrate holder 11 receives a supply of the above-described carrier gas and source material gas while being heated, thus causing the formation of buffer layer 2 which is an epitaxial growth film doped with nitrogen (N) atoms on main surface 1A. Specifically, buffer layer 2 is formed under conditions including a growth temperature of not less than 1500° C. and not more than 1650° C., and a pressure of not less than $8 \times 10^3$ Pa and not more than $12 \times 10^3$ Pa. Here, a flow rate of the $NH_3$ gas is adjusted such that the n type impurity concentration in buffer layer 2 is approximately $1 \times 10^{18}$ cm$^3$. Buffer layer 2 has a thickness of approximately 0.5 μm.

In the first source material gas used to form buffer layer 2 in this step (S12), a ratio of the number of C atoms to the number of Si atoms (C/Si ratio) is not less than 1.6 and not more than 2.2. This is because the use of a source material gas having a C/Si ratio higher than 2.2 results in the occurrence of crystal defects in buffer layer 2 to be formed. This is also because the use of a source material gas having a C/Si ratio lower than 1.6 results in an increase in background concentration of N atoms in buffer layer 2 to be formed. To the extent that the background concentration of N atoms is allowed, the surface morphology of buffer layer 2 to be formed can be obtained if the C/Si ratio is not less than 1.0. A ratio of the number of Si atoms to the number of H atoms (Si/H ratio) is not less than 0.0002 and not more than 0.0006. A ratio of the number of ammonia molecules to the number of hydrogen molecules ($NH_3/H_2$ ratio) is not less than $2.0 \times 10^{-8}$ and not more than $1.0 \times 10^{-6}$.

Next, in the step (S13), drift layer 3 is formed using the CVD device on buffer layer 2 formed in the previous step (S12). First, a carrier gas containing $H_2$, and a source material gas containing $SiH_4$, $C_3H_8$, $NH_3$ and the like are introduced into the reaction chamber. Here, each gas is introduced into the reaction chamber such that the gas has been thermally decomposed to a sufficient degree at the time when supplied onto main surface 1A of silicon carbide substrate 1.

Silicon carbide substrate 1 placed in the reaction chamber receives a supply of the above-described carrier gas and source material gas while being heated, thus causing the formation of drift layer 3 which is an epitaxial growth film doped with N atoms on buffer layer 2. Specifically, drift layer 3 is formed under conditions including a growth temperature of not less than 1500° C. and not more than 1650° C., and a pressure of not less than $8 \times 10^3$ Pa and not more than $12 \times 10^3$ Pa. Here, a flow rate of the $NH_3$ gas is adjusted such that the n type impurity concentration in drift layer 3 is approximately $7 \times 10^{15}$ cm$^{-3}$. Drift layer 3 has a thickness of approximately not less than 10 μm and not more than 15 μm.

In the second source material gas used to form drift layer 3 in this step (S13), the ratio of the number of C atoms to the number of Si atoms (C/Si ratio) is not less than 1.6 and not more than 2.2. This is for the same reason as that for the first source material gas in the previous step (S12). The ratio of the number of Si atoms to the number of H atoms (Si/H ratio) is not less than 0.0002 and not more than 0.0006. The ratio of the number of ammonia molecules to the number of hydrogen molecules ($NH_3/H_2$ ratio) is not less than $2.0 \times 10^{-8}$ and not more than $1.0 \times 10^{-6}$.

After the formation of buffer layer 2 in the previous step (S12) is completed, this step (S13) may be performed successively by varying the flow rate and partial pressure of the material gas, with silicon carbide substrate 1 remaining on substrate holder 11. In other words, in the method of manufacturing a silicon carbide semiconductor substrate of this embodiment, the first source material gas and the second source material gas contain the same gaseous species with different flow rates and partial pressures of the gases. Accordingly, buffer layer 2 and drift layer 3 can be readily grown successively.

What is particularly important in the method of manufacturing a silicon carbide semiconductor substrate of this embodiment is the C/Si ratio in the first source material gas used in the step (S12) and the second source material gas used in the step (S13).

When a source material gas having a high C/Si ratio is used, although a silicon carbide epitaxial layer to be formed has good morphology, the amount of N atoms doped into the silicon carbide epitaxial layer is limited. Thus, the use of a source material gas having a high C/Si ratio results in difficulty in forming a silicon carbide epitaxial layer having a high impurity concentration.

When a source material gas having a low C/Si ratio is used, on the other hand, although a silicon carbide epitaxial layer doped with a higher concentration of N atoms can be formed, the silicon carbide epitaxial layer has poorer morphology. Thus, the use of a source material gas having a low C/Si ratio results in difficulty in forming a silicon carbide epitaxial layer having good morphology.

In a conventional method of manufacturing a silicon carbide semiconductor substrate, each silicon carbide epitaxial layer is formed using $N_2$ gas as a dopant gas, and using a source material gas having a C/Si ratio of not less than 1.0 and not more than 1.5 regardless of the impurity concentration. Nitrogen molecules used for the dopant gas include a triple bond between nitrogen atoms, however. It is thus difficult to thermally decompose nitrogen molecules and introduce nitrogen atoms as an active species into the silicon carbide epitaxial layer. It is even more difficult to dope main surface 1A of the silicon carbide substrate with N atoms evenly within the surface. On the other hand, the silicon carbide semiconductor substrate to be obtained has poor morphology and includes numerous defects. When each silicon carbide epitaxial layer is formed using a source material gas having a C/Si ratio of not less than 1.0 and not more than 1.5 in the conventional method, although the amount of introduced nitrogen atoms can be up to approximately $2 \times 10^{18}$ cm$^3$, the silicon carbide epitaxial layer includes numerous defects.

That is, in the conventional method of manufacturing a silicon carbide semiconductor substrate using $N_2$ as a dopant gas, reducing the C/Si ratio in the source material gas so as to form an n type silicon carbide epitaxial layer having a higher impurity concentration than the current concentration results in even poorer morphology of the silicon carbide semiconductor substrate to be obtained. Increasing the C/Si ratio in the source material gas so as to improve the morphology as compared to the current morphology, on the other hand, results in even more difficulty in manufacturing a silicon carbide semiconductor substrate including an n type silicon carbide epitaxial layer having a high impurity concentration.

In the method of manufacturing a silicon carbide semiconductor substrate of this embodiment, therefore, $NH_3$ is used as a dopant gas, and a source material gas having a higher C/Si ratio than in the conventional method of manufacturing a silicon carbide semiconductor substrate is used.

$NH_3$ requires a lower temperature than $N_2$ for thermal decomposition, and is readily decomposed at a general growth temperature when forming a silicon carbide epitaxial layer (approximately between 1400° C. and 1700° C. as described above). N atoms are thus readily introduced as an active species into the silicon carbide epitaxial layer. As a result, even if the C/Si ratio is made higher than in the conventional method of manufacturing a silicon carbide semiconductor substrate, a silicon carbide epitaxial layer having a higher impurity concentration than in the conventional manufacturing method can be formed. Specifically, even if the C/Si ratio is not less than 1.6 and not more than 2.2, a silicon carbide epitaxial layer having a high impurity concentration of approximately $2\times10^{18}$ cm$^{-3}$ can be formed. Furthermore, since the C/Si ratio can be made higher than in the conventional method of manufacturing a silicon carbide semiconductor substrate, a silicon carbide semiconductor substrate having better morphology than conventional morphology can be fabricated.

Furthermore, as described above, when $N_2$ gas is used as a dopant gas as in the conventional method of manufacturing a silicon carbide semiconductor substrate, it is preferable to reduce the C/Si ratio so as to form a silicon carbide epitaxial layer having a high impurity concentration, however, this results in poorer morphology. For this reason, it has been difficult in terms of morphology to provide a silicon carbide epitaxial layer having a high impurity concentration as a top layer in a silicon carbide semiconductor substrate. In this case, the poor morphology of the silicon carbide semiconductor substrate needs to be suppressed by providing a silicon carbide epitaxial layer having a low impurity concentration formed with a source material gas having an increased C/Si ratio on the above-described silicon carbide epitaxial layer having a high impurity concentration.

In contrast, the method of manufacturing a silicon carbide semiconductor substrate of this embodiment can form a silicon carbide epitaxial layer having a high impurity concentration using a source material gas having a high C/Si ratio, thus allowing the silicon carbide epitaxial layer to have good morphology. According to the method of manufacturing a silicon carbide semiconductor substrate of this embodiment, therefore, a silicon carbide semiconductor substrate having an arbitrary configuration can be fabricated without imposing limitations in terms of morphology.

Moreover, since the source material gases having the same C/Si ratio can be used when forming the silicon carbide epitaxial layer having a relatively high impurity concentration and the silicon carbide epitaxial layer having a relatively low impurity concentration stacked on each other, they can be grown successively without changing the growth conditions other than the flow rate of the $NH_3$ gas.

As described above, the method of manufacturing a silicon carbide semiconductor substrate of this embodiment can readily manufacture a silicon carbide semiconductor substrate which includes a silicon carbide epitaxial layer having a high impurity concentration and which includes few crystal defects and has good morphology, by using $N_2$ gas as a dopant gas, and employing the C/Si ratio of not less than 1.6 and not more than 2.2 in the source material gases used for growing the silicon carbide epitaxial layers.

Although the silicon carbide semiconductor substrate of this embodiment includes buffer layer 2 having a thickness of 0.5 μm and an impurity concentration of $1\times10^{18}$ cm$^{-3}$ as a first silicon carbide semiconductor layer, and drift layer 3 having a thickness of 10 μm and an impurity concentration of $7\times10^{15}$ cm$^{-3}$ as a second silicon carbide semiconductor layer, the substrate is not limited to include these layers. For example, the substrate may include a low impurity concentration layer having an impurity concentration of approximately not less than $1\times10^{14}$ cm$^{-3}$ and not more than $5\times10^{15}$ cm$^{-3}$ and a thickness of 20 μm, which is stacked on a high impurity concentration layer having an impurity concentration of approximately not more than $2\times10^{18}$ cm$^{-3}$. Again, with this configuration, a silicon carbide semiconductor substrate having good morphology can be obtained using the above-described source material gases having the same C/Si ratio.

Although the silicon carbide semiconductor substrate of this embodiment has a structure in which the two layers having different impurity concentrations are stacked on the silicon carbide substrate, the substrate may have a structure in which three or more layers having different impurity concentrations are stacked on the silicon carbide substrate in an arbitrary configuration. Again, with this configuration, a silicon carbide semiconductor substrate which includes a silicon carbide epitaxial layer having a high impurity concentration and which includes few crystal defects and has good morphology can be obtained, as compared to a silicon carbide semiconductor substrate obtained with the conventional method of manufacturing a silicon carbide semiconductor substrate.

Although the CVD (Chemical Vapor Deposition) device is used as a vapor phase epitaxy device in the method of manufacturing a silicon carbide semiconductor substrate of this embodiment, the used device is not limited to this device. Any device capable of forming a silicon carbide epitaxial layer by vapor phase epitaxy can be used.

In the step of forming the silicon carbide epitaxial layer, the morphology can be improved by increasing the growth temperature as well. A high growth temperature of not less than 1700° C. is required in order to improve the morphology by the growth temperature. Unfortunately, even if the growth temperature is not less than 1700° C., a silicon carbide epitaxial layer to be formed includes crystal defects to further deteriorate the epitaxial growth device. The method of manufacturing a silicon carbide semiconductor substrate of this embodiment can provide a silicon carbide semiconductor substrate having good morphology without increasing the growth temperature, as compared to the conventional method of manufacturing a silicon carbide semiconductor substrate.

In the method of manufacturing a silicon carbide semiconductor substrate of this embodiment, it is preferable that the growth temperature be not less than 1500° C. and not more than 1650° C. in both the step (S12) and step (S13). By employing this temperature range, the occurrence of defects can be more readily suppressed to provide a silicon carbide semiconductor substrate having good surface morphology.

Figure 4:
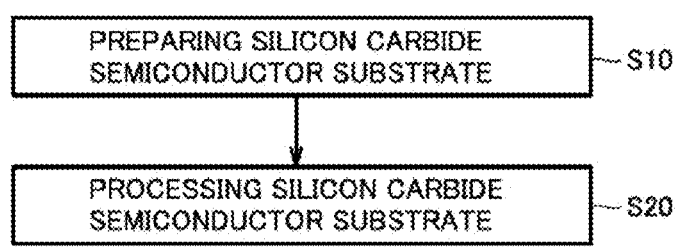
FIG. 4 is a flowchart of a method of manufacturing a silicon carbide semiconductor device of this embodiment.

Referring now to FIG. 4, the method of manufacturing a silicon carbide semiconductor device of this embodiment is described. The method of manufacturing a silicon carbide semiconductor device of this embodiment includes a step of preparing a silicon carbide semiconductor substrate (S10) and a step of processing the silicon carbide semiconductor substrate (S20).

In the step (S10), a silicon carbide semiconductor substrate is manufactured with the method of manufacturing a silicon carbide semiconductor of this embodiment. Consequently, the silicon carbide semiconductor substrate having good morphology can be prepared.

In the step (S20), the silicon carbide semiconductor substrate prepared in the previous step (S10) is processed to manufacture a silicon carbide semiconductor device. Specifically, the silicon carbide semiconductor substrate is subjected to an ion implantation step, a trench formation step, a film formation step, an electrode formation step and the like, to manufacture a silicon carbide semiconductor device. Consequently, the silicon carbide semiconductor device can effectively utilize the silicon carbide epitaxial layer having a high impurity concentration included in the silicon carbide semiconductor substrate. In addition, performance degradation of the silicon carbide semiconductor device resulting from defects and poor morphology of the silicon carbide semiconductor substrate can be suppressed, thus allowing for high-yield manufacturing of silicon carbide semiconductor devices.

EXAMPLES

Examples of the present invention will be described below.

1. Evaluation Samples (i) Example Sample

First, a silicon carbide substrate having an outer diameter of 4 inches and a thickness of 350 μm was prepared.

Then, a CVD device was used to grow a silicon carbide epitaxial layer on a main surface of the silicon carbide substrate, and form a buffer layer having an impurity concentration of $1 \times 10^{18}$ cm' to a thickness of 0.5 μm. Here, a carrier gas containing $H_2$, and a source material gas containing $SiH_4$, $C_3H_8$ and $NH_3$ were introduced into a reaction chamber of the CVD device under conditions such that the C/Si ratio is 1.9, Si/H is 0.0004, and $NH_3/H_2$ is $1 \times 10^{-5}$ cm$^3$. The flow rate of $NH_3$ was 0.05 sccm. The pressure in the reaction chamber was not less than $8 \times 10^3$ Pa and not more than $12 \times 10^3$ Pa, and the growth temperature was 1580° C.

Subsequently, the CVD device was used to form a drift layer on a main surface of the buffer layer using the same gases and under the same pressure and temperature conditions, with a flow rate of $NH_3$ of 0.05 sccm. The drift layer had an impurity concentration of $7.0 \times 10^{15}$ cm$^3$ and a thickness of 10 μm.

(ii) Comparative Example Sample 1

A comparative example sample 1 basically had the same configuration and was prepared under the same conditions as the example sample. The difference was that the source material gas used to form the buffer layer and the drift layer was introduced under conditions such that the C/Si ratio was 2.5.

(iii) Comparative Example Sample 2

A comparative example sample 2 basically had the same configuration and was prepared under the same conditions as the example sample. The difference was that the source material gas used to form the buffer layer and the drift layer was introduced under conditions such that the C/Si ratio was 1.5.

In this manner, three types of silicon carbide semiconductor substrates were prepared using the source material gas having different C/Si ratios.

2. Experiments

Figure 5:
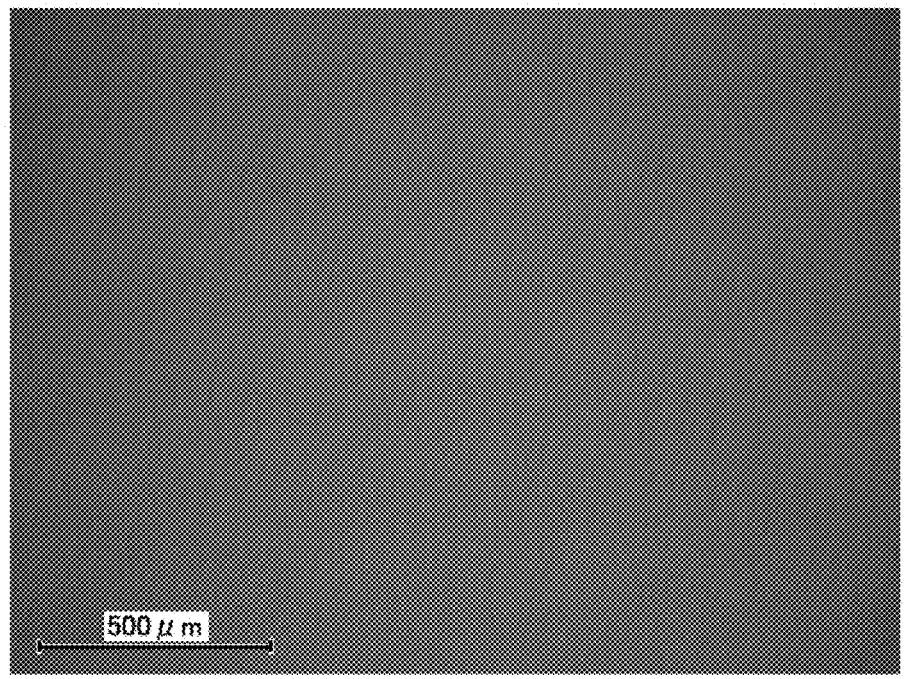
FIG. 5 shows an image of an example sample of this example, which was observed with a differential interference microscope.
Figure 6:
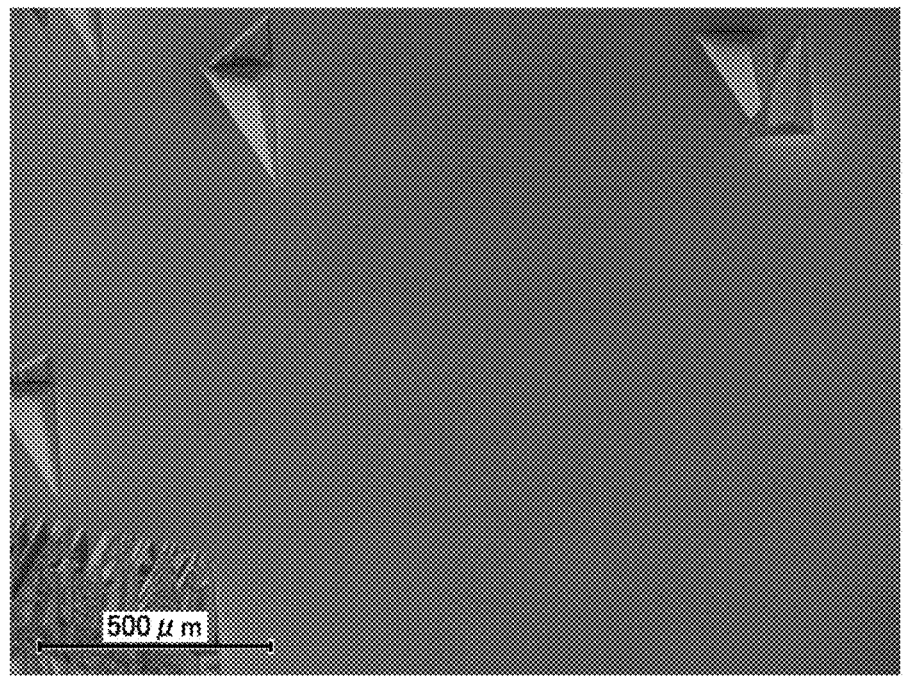
FIG. 6 shows an image of a comparative example sample 1 of this example, which was observed with the differential interference microscope.
Figure 7:
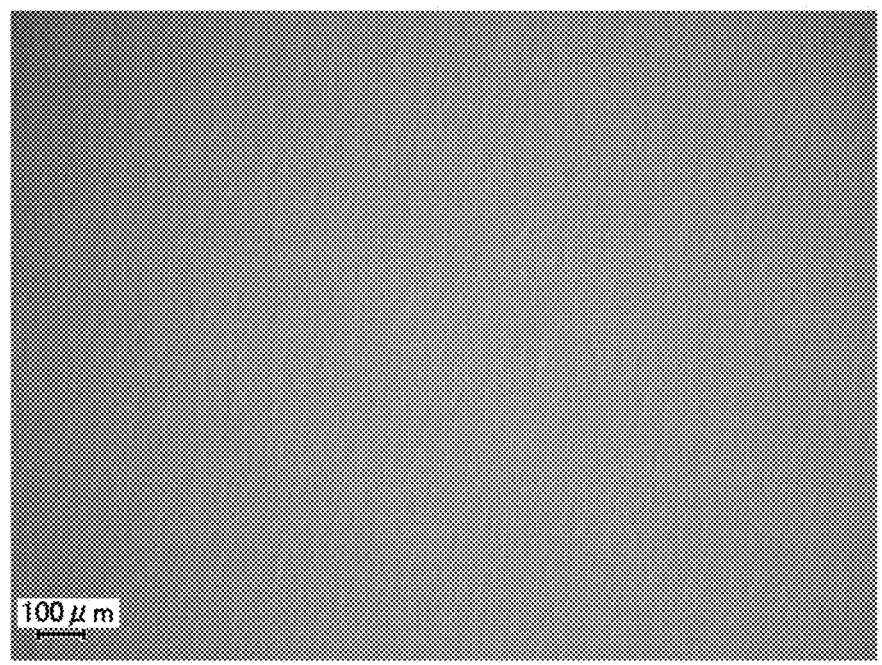
FIG. 7 shows an image of a comparative example sample 2 of this example, which was observed with the differential interference microscope.

The surface morphologies of the three types of silicon carbide semiconductor substrates thus obtained were evaluated with a differential interference microscope. Specifically, the surfaces of the silicon carbide semiconductor substrates were observed with a 10x objective lens and a 10x eyepiece lens. FIG. 5 shows an image of the example sample observed with the differential interference microscope, FIG. 6 shows an image of comparative example sample 1, and FIG. 7 shows an image of comparative example sample 2.

3. Results

As shown in FIG. 5, the silicon carbide semiconductor substrate of the example sample prepared at the C/Si ratio of 1.9 had good surface morphology. On the other hand, as shown in FIG. 6, etch pits were identified on the main surface of the silicon carbide semiconductor substrate of comparative example sample 1 prepared at the C/Si ratio of 2.5. In addition, as shown in FIG. 7, the silicon carbide semiconductor substrate of comparative example sample 2 prepared at the C/Si ratio of 1.5 had good surface morphology, however, the silicon carbide semiconductor substrate of the example sample prepared at the C/Si ratio of 1.9 had better surface morphology. In other words, the silicon carbide semiconductor substrate prepared at the C/Si ratio of 1.9 had better surface morphology than that of the silicon carbide semiconductor substrate prepared at the C/Si ratio of 1.5 or 2.5.

Although the embodiments and examples of the present invention have been described above, the embodiments and examples described above can be modified in various ways. In addition, the scope of the present invention is not limited to the embodiments and examples described above. The scope of the present invention is defined by the terms of the claims, and is intended to include any modifications within the scope and meaning equivalent to the terms of the claims.

INDUSTRIAL APPLICABILITY

The method of manufacturing a silicon carbide semiconductor substrate and the method of manufacturing a silicon carbide semiconductor device of the present invention is applied particularly advantageously to a method of manufacturing a silicon carbide semiconductor substrate required to include a silicon carbide epitaxial layer doped with a high concentration of nitrogen and to have good morphology, and a method of manufacturing a silicon carbide semiconductor device.

REFERENCE SIGNS LIST 1 silicon carbide substrate; 1A, 2A, 3A main surface; 2 buffer layer; 3 drift layer; 10 silicon carbide semiconductor substrate; 11 substrate holder; 12 induction heating coil; 13 quartz tube; 14 heat insulating material; 15 heating element; 16 pipe; 10 CVD device.

The invention claimed is:

1. A method of manufacturing a silicon carbide semiconductor substrate, comprising steps of:
   preparing a silicon carbide substrate;
   forming a first silicon carbide semiconductor layer on the silicon carbide substrate using a first source material gas; and
   forming a second silicon carbide semiconductor layer on the first silicon carbide semiconductor layer using a second source material gas,
   wherein an impurity concentration in the first silicon carbide semiconductor layer is higher than an impurity concentration in the second silicon carbide semiconductor layer,
   in the step of forming a first silicon carbide semiconductor layer and the step of forming a second silicon carbide semiconductor layer, ammonia gas being used as a dopant gas, the first source material gas having a C/Si ratio of not less than 1.6 and not more than 2.2, the C/Si ratio being the number of carbon atoms to the number of silicon atoms,
   a flow rate of the first source material gas being different from a flow rate of the second source material gas.

2. The method of manufacturing a silicon carbide semiconductor substrate according to claim 1, wherein
   the thickness of the first silicon carbide semiconductor layer is smaller than the thickness of the second silicon carbide semiconductor layer.

3. The method of manufacturing a silicon carbide semiconductor substrate according to claim 1, wherein
   the first source material gas and the second source material gas each contain monosilane and propane.

4. The method of manufacturing a silicon carbide semiconductor substrate according to claim 1, wherein
   the impurity concentration in the second silicon carbide semiconductor layer is not less than $1 \times 10^{14}$ cm$^{-3}$ and not more than $7 \times 10^{15}$ cm$^{-3}$.

5. A method of manufacturing a silicon carbide semiconductor device, comprising steps of:
   preparing a silicon carbide semiconductor substrate; and
   processing the silicon carbide semiconductor substrate,
   in the step of preparing a silicon carbide semiconductor substrate, the silicon carbide semiconductor substrate being manufactured with the method of manufacturing a silicon carbide semiconductor substrate according to claim 1.

6. A method of manufacturing a silicon carbide semiconductor device, comprising steps of:
   preparing a silicon carbide semiconductor substrate; and
   processing the silicon carbide semiconductor substrate,
   in the step of preparing a silicon carbide semiconductor substrate, the silicon carbide semiconductor substrate being manufactured with the method of manufacturing a silicon carbide semiconductor substrate according to claim 1.

7. A method of manufacturing a silicon carbide semiconductor device,
   comprising steps of:
   preparing a silicon carbide semiconductor substrate; and
   processing the silicon carbide semiconductor substrate,
   in the step of preparing a silicon carbide semiconductor substrate, the silicon carbide semiconductor substrate being manufactured with the method of manufacturing a silicon carbide semiconductor substrate according to claim 2.

8. A method of manufacturing a silicon carbide semiconductor device,
   comprising steps of:
   preparing a silicon carbide semiconductor substrate; and
   processing the silicon carbide semiconductor substrate,
   in the step of preparing a silicon carbide semiconductor substrate, the silicon carbide semiconductor substrate being manufactured with the method of manufacturing a silicon carbide semiconductor substrate according to claim 3.

9. A method of manufacturing a silicon carbide semiconductor device,
   comprising steps of:
   preparing a silicon carbide semiconductor substrate; and
   processing the silicon carbide semiconductor substrate,
   in the step of preparing a silicon carbide semiconductor substrate, the silicon carbide semiconductor substrate being manufactured with the method of manufacturing a silicon carbide semiconductor substrate according to claim 4.

* * * * *